United States Patent [19]
Chatterjee et al.

[11] Patent Number: 6,015,992
[45] Date of Patent: Jan. 18, 2000

[54] BISTABLE SCR-LIKE SWITCH FOR ESD PROTECTION OF SILICON-ON-INSULATOR INTEGRATED CIRCUITS

[75] Inventors: Amitava Chatterjee; Ekanayake Amerasekera, both of Plano, Tex.

[73] Assignee: Texas Instruments Incorporated, Dallas, Tex.

[21] Appl. No.: 09/001,058

[22] Filed: Dec. 30, 1997

Related U.S. Application Data

[60] Provisional application No. 60/034,680, Jan. 3, 1997.

[51] Int. Cl.$^7$ .................................................. H01L 29/74
[52] U.S. Cl. ......................... 257/350; 257/358; 257/359; 257/360; 257/361; 257/109; 257/111; 257/154
[58] Field of Search ..................................... 257/350, 351, 257/355, 358–359, 360, 361, 109, 111, 154, 173

[56] References Cited

U.S. PATENT DOCUMENTS

| | | | |
|---|---|---|---|
| 5,240,865 | 8/1993 | Malhi | 438/135 |
| 5,708,288 | 1/1998 | Quigley et al. | 257/355 |
| 5,751,022 | 5/1998 | Yasuhara et al. | 257/154 |

Primary Examiner—John Guay
Attorney, Agent, or Firm—Jacqueline J. Garner; Wade James Brady; Richard L. Donaldson

[57] ABSTRACT

A bistable SCR-like switch (41) protects a signal line (65) of an SOI integrated circuit (40) against damage from ESD events. The bistable SCR-like switch (41) is provided by a first and a second transistors (42 and 44) which are formed upon the insulator layer (46) of the SOI circuit (40) and are separated from one another by an insulating region (60). Interconnections (62 and 64) extend between the two transistors (42 and 44) to connect a P region (62) of a first transistor (42) to a P region (54) of the second transistor (44) and an N region (50) of the first transistor (42) to an N region (58) of the second transistor (44). The transistors (42 and 44) may be either bipolar transistors or enhancement type MOSFET transistors. For bipolar transistors, the base of an NPN transistor (42) is connected to the collector of a PNP transistor (44) and the base of the PNP transistor (44) is connected to the collector of the NPN transistor (42). MOSFET transistors are similarity connected, with the intermediate portion of the P-well (43) forming channel region of the N-channel transistor (42) connected to the drain of the P-channel transistor (44), and the N-well (45) forming the channel region of the P-channel transistor (44) connected to the drain of the N-channel transistor (42). Resistors (72 and 74) can be connected between the two transistors (42 and 44) to determine the trigger and holding voltages for the bistable SCR-like switch (41).

9 Claims, 3 Drawing Sheets

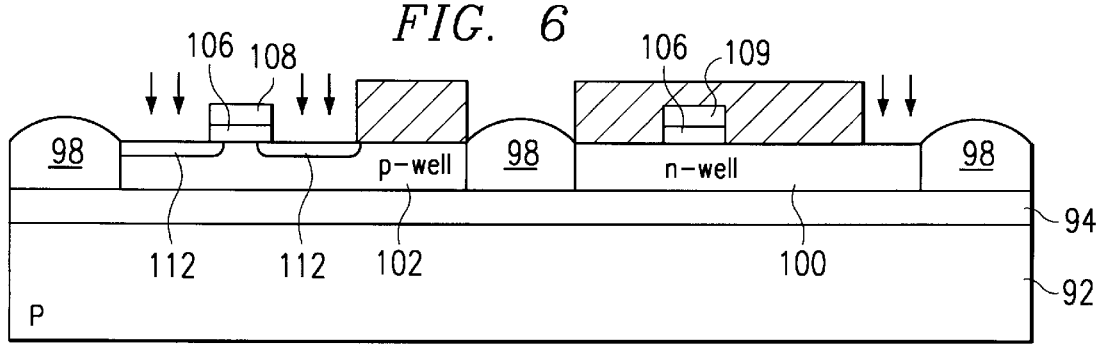
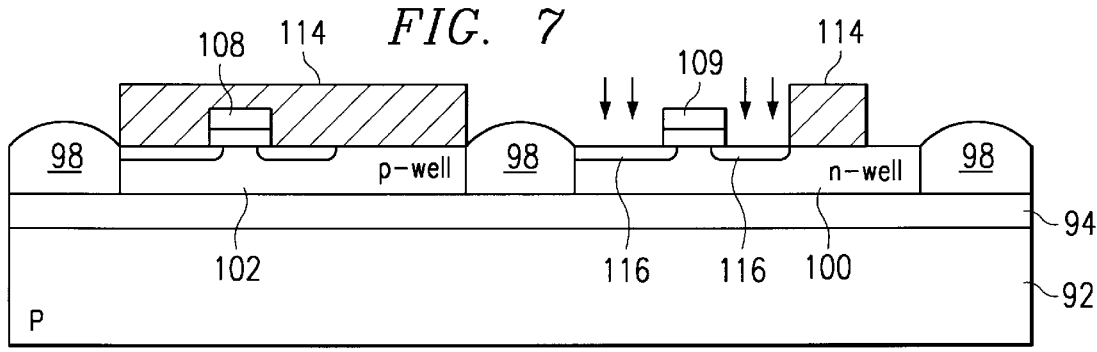
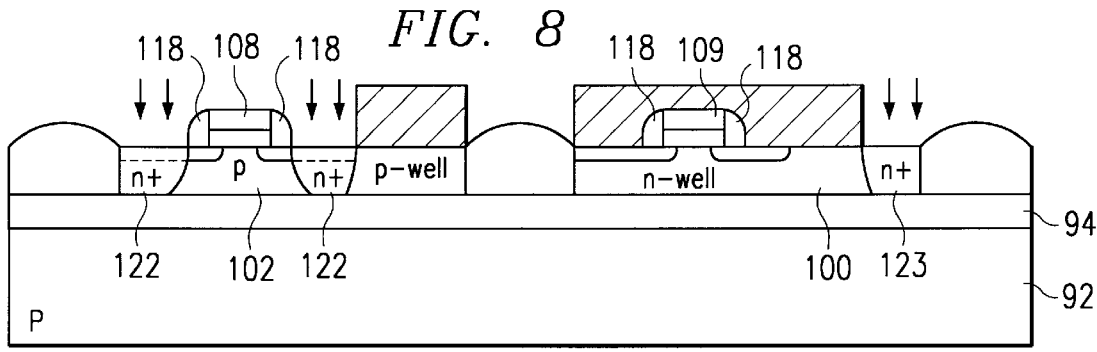
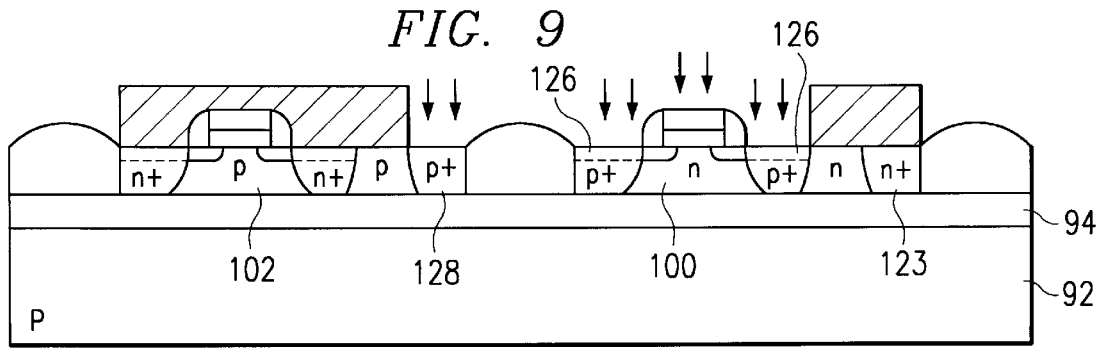

6,015,992

BISTABLE SCR-LIKE SWITCH FOR ESD PROTECTION OF SILICON-ON-INSULATOR INTEGRATED CIRCUITS

This application claims priority under 35 USC § 119(e)(1) of provisional application number 60/034,680 filed Jan. 3, 1997.

TECHNICAL FIELD OF THE INVENTION

The present invention relates in general to electrostatic discharge protection for electronic circuits, and in particular to a bistable SCR-like switch for providing electrostatic discharge protection for integrated circuits fabricated with SOI technology.

BACKGROUND OF THE INVENTION

Prior art electrostatic discharge (ESD) protection devices have been utilized for protecting integrated circuits from being damaged by the high voltage of ESD events. Silicon controlled rectifier (SCR) circuits have emerged as the preferred mode of protecting integrated circuits from ESD events. An SCR is a device which can quickly switch from a high impedance blocking mode to a low impedance shunting latch mode when ESD events are encountered. SCRs are fabricated as an integral part of the integrated circuits.

Recent advances in integrated circuits have included the further development of silicon-on-insulator (SOI) technology, in which an insulator layer is embedded within a substrate and extends beneath the active regions of an integrated circuit. A problem arises since SCRS, the preferred device for protecting against ESD events in integrated circuits, are not suitable for use in SOI integrated circuits. Prior art SCRs typically included two transistors, a PNP transistor and an NPN transistor, which were formed into a substrate, such as a P-type of substrate. The substrate provided a common region of the two transistors, providing the base of one transistor and the collector of the other transistor. Prior art SCRs also typically included a well, such as an N-well, which also provided a common region of the two transistors, providing the base of one transistor and the collector of the other transistor. This arrangement of shared regions between the PNP and NPN transistors caused prior art SCRs to go from a nonconductive, blocking mode when a trigger voltage was applied to the SCRS, to latch in a conductive, shunting mode until the voltage applied thereto fell beneath a holding voltage. Prior art SCRs can not readily be realized in SOI circuits since the portion of the substrate above the embedded insulator layer is relatively thin such that field oxide insulators extend through the top layer of substrate to the embedded insulator layer. Also, N+ and P+ regions typically extend through the top layer of substrate such that embedded resistors cannot be formed between doped regions separated by another doped region.

SUMMARY OF THE INVENTION

The present invention disclosed and claimed herein describes a bistable SCR-like switch for protecting a signal line of an SOI integrated circuit against damage from ESD events. The bistable SCR-like switch is provided by two separate transistors which are formed upon an insulator without having a common, shared semiconductor region that provides an active portion for each of the transistors. Both of the transistors are formed in an upper layer substrate overlying an insulating oxide layer of the SOI circuit, with the two transistors separated from one another by an insulating, field region. Interconnections extend between active portions of the two transistors, such that an ESD event will cause the bistable SCR switch to go from a high impedance blocking mode to a low impedance shunting latch mode. First and second resistors are interconnected between the two transistors to determine trigger and holding voltages for the bistable SCR-like switch.

In another aspect of the present invention, the two transistors are bipolar transistors, with one being an NPN transistor and the other being a PNP transistor, both of which are formed upon the oxide insulating layer. The emitter of the PNP transistor provides an anode for the bistable SCR-like switch and is connected to a signal line of the SOI circuit being protected. A first interconnect extends between the base of the PNP transistor and the collector of the NPN transistor. A second interconnect extends between the collector of the PNP transistor and the base of the NPN transistor. The emitter of the NPN transistor provides a cathode for the SCR-like bistable switch and is connected to a ground reference. A first resistor has one end connected to the emitter of the PNP transistor and the other end connected to the collector of the NPN transistor, and the second resistor has a first end connected to the collector of the PNP transistor and a second end connected to the emitter of the NPN transistor to determine the trigger voltage and the holding voltage for the bistable SCR-like switch.

BRIEF DESCRIPTION OF THE DRAWINGS

For a more complete understanding of the present invention and the advantages thereof, reference is now made to the following description taken in conjunction with the accompanying Drawings in which:

FIG. 6 illustrates a cross-sectional view of a semiconductor substrate during formation of the N-channel transistor, LDD implant;

FIG. 7 illustrates a cross-sectional view of the semiconductor substrate during formation of the P-channel transistor, LDD implant;

FIG. 8 illustrates a cross-sectional view of the semiconductor substrate during formation of the source/drain regions in the N-channel transistors; and FIG. 9 illustrates a sectional view of the semiconductor substrate during formation of the source/drain regions in the P-channel transistors.

DETAILED DESCRIPTION OF THE INVENTION

Figure 1:
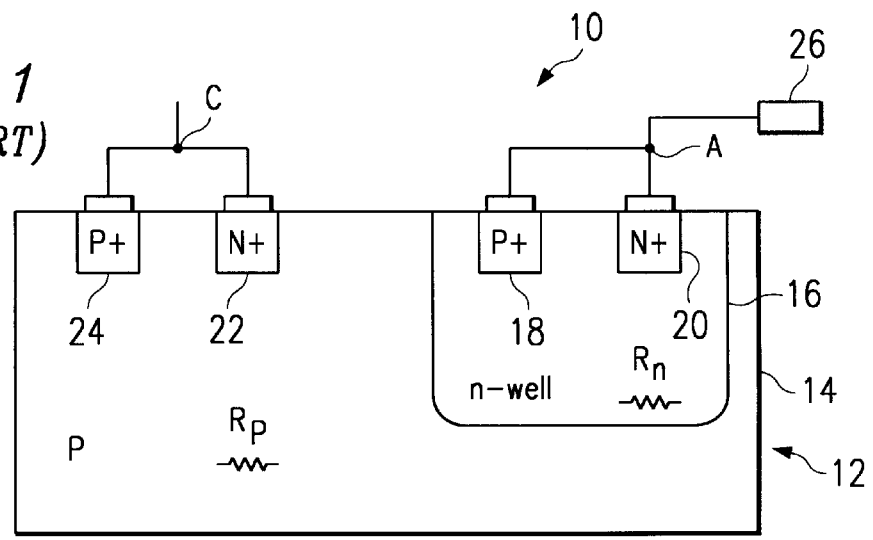
FIG. 1 illustrates a cross-sectional view of a prior art SCR included in an integrated circuit.

Referring now to FIG. 1, there is illustrated a cross-sectional view a silicon controlled rectifier (SCR) 10 of a prior art integrated circuit 12. Integrated circuit 12 is formed with a substrate 14, which is preferably a P-substrate. An N-well 16 is disposed within the substrate 14. A P+ region 18 and an N+ region 20 are defined within the N-well 16. The P+ region 18 and the N+ region 20 are both connected to a signal line 26 of the integrated circuit 12 which is being protected. An N+ region 22 is disposed in the P-substrate 14, spaced apart from the N-well 16. A P+ region 24 is formed within the P-substrate 14, on an opposite side of the N+ region 22 from the N-well 16. The P+ region 24 is spaced apart from the N-well 16 such that the portion of the P-substrate 14 therebetween will provide a resistance $R_P$. Also, the N+ region 20 is spaced apart from the junction between the P-substrate 14 and the N-well 16 such that the portion of the N-well 16 disposed therebetween provides a resistance $R_N$. The N+ region 22 and the P+ region 24 are both connected to a cathode node C, which is connected to a ground reference.

Figure 2:
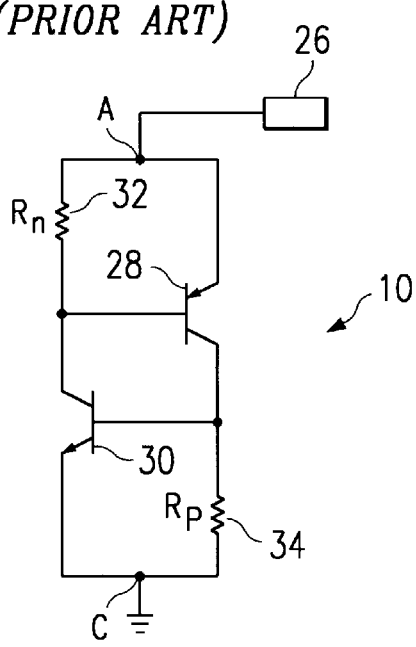
FIG. 2 illustrates a schematic diagram of the prior art SCR depicted in FIG. 1.

Referring now to FIG. 2, there is illustrated a schematic diagram of the SCR of the integrated circuit 12 depicted in FIG. 1. The SCR 10 is comprised of a PNP transistor 28 and an NPN transistor 30. The emitter of the transistor 28 is connected to the anode A, which is connected to a pad of the signal line 26. The base of the transistor 28 is connected to the collector of the transistor 30. The base of the transistor 30 is connected to the collector of the transistor 28. The emitter of the transistor 30 is connected to the cathode of the SCR, which cathode is labeled "C", and is connected to a ground reference voltage. One end of a resistor 32 of resistance $R_N$ is connected to the collector of the transistor 30 and the base of the transistor 28. The other end of the resistor 32 is connected to the emitter of the transistor 28. One end of a resistor 34 of resistance $R_P$. is connected to the collector of the transistor 28 and the base of the transistor 30. The other end of the resistor 34 is connected to the emitter of the transistor 30, which is connected to cathode C. The resistance $R_N$ of resistor 32 and the resistance $R_P$ of resistor 34 are selected to determine the trigger voltage and the holding voltage of the SCR.

As illustrated in FIGS. 1 and 2, the resistance $R_P$ of the resistor 34 is determined by the spacing between the P+ region 24 and the N+ region 22, and the level and type of dopants disposed in the portion of the P-substrate 14 extending therebetween. The resistance $R_N$ of the resistor 32 is determined by the spacing between the N+ region 20 and the P+ region 18, and the level and type of dopants disposed in the region of N-well 16 extending therebetween. The transistor 28 comprises an emitter provided by the P+ region 18, a base provided by the N-well region 16, and a collector provided by the P-substrate 14. The transistor 30 comprises an emitter provided by the N+ region 22, a base provided by the P-substrate 14, and a collector provided by the N-well 16. The transistor 28 and the transistor 30 share a first common semiconductor region, the N-well 16, which provides the base for the transistor 28 and the collector for the transistor 30. The transistors 28 and 30 share a second common semiconductor region, the P-substrate 14, which provides the collector of the transistor 28 and the base of the transistor 30.

Figure 3:
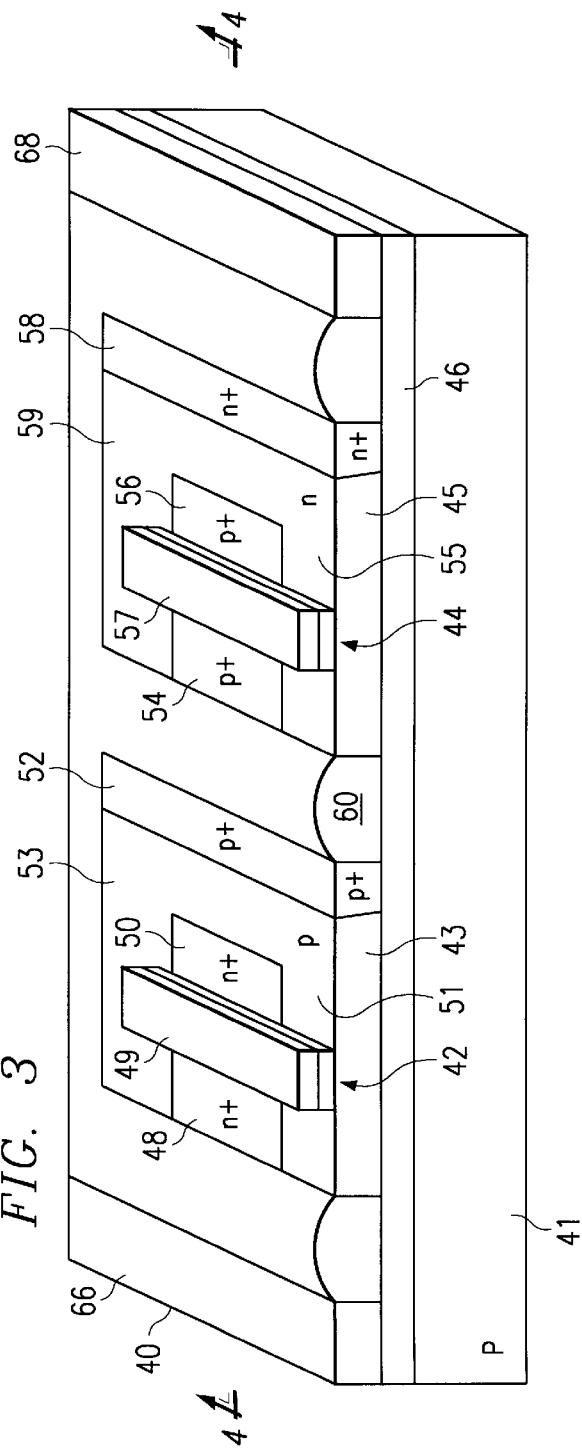
FIG. 3 illustrates a sectioned perspective view of a bistable SCR-like switch fabricated according to the present invention.

Referring now to FIG. 3, there is illustrated a perspective sectioned view of a bistable SCR-like switch representing the preferred embodiment of the present invention. This is generally referred to as an integrated circuit 40. For illustrative purposes, the upper interconnect layer is not illustrated, this being illustrated hereinbelow. A P-type substrate 41 is provided which has formed therein an insulating layer 46. The insulating layer 46 is an implanted layer formed according to silicon-on-insulator (SOI) technology techniques. This results in an upper layer of unoxidized substrate overlying the oxide layer 46. This upper layer substrate is the layer in which the active circuits are formed, this upper layer of substrate being between 0.01–1.0 microns thick.

There are two active regions defined therein, an active region 43 and an active region 45. These active regions are defined by first masking off the upper layer of substrate and implanting P-type impurities to form the region 43 and then masking off the implanted N-type regions 43 and implanting N-type impurities to form N-type regions, the region 45. These, of course, at this point in the process are adjacent regions. Thereafter, field oxide regions 60 are formed to separate the active regions 43 and 45. This is achieved with conventional field oxide techniques utilizing either a LOCOS isolation process or a trench isolation process, both of these being conventional processes.

Once the active regions 43 and 45 are defined, the next step of the process will be to form transistors therein. In general, N-channel transistors are formed in the P-type region 43 and P-channel transistors in the N-type region 45. It should be understood that there are a plurality of P-type regions 43 on the substrate and a plurality of N-type regions 45. These, of course, are utilized to fabricate the other logic circuitry associated with the overall integrated circuit.

For the SCR of the present invention, there are formed in the P-type region 43 two N+ regions 48 and 50 separated by a gate electrode 49. This gate electrode 49, as will be described hereinbelow, is a dummy gate electrode, provided such that the N+ regions 48 and 50 are formed with the source/drain process associated with conventional transistor technology. In a similar manner, a P-channel transistor 44 is formed in the N-type region 45. This results in a P+ region 54 and a P+ region 56 formed therein separated by a channel region over which a gate electrode 57 is disposed, this gate electrode 57 being a dummy gate electrode. This therefore results in a P-channel transistor 44 being formed in the N-type region 45 and an N-channel transistor 42 formed in the P-type region 43.

In addition to the transistors 42 and 44 formed in the regions 43 and 45, respectively, a P+ contact region 52 is formed within the P-type region 43 and an N+ contact region 58 is formed in the N-type region 45. Also, it is noted that the N+ regions 48 and 50 do not extend along the entire length of the P-type region 43 and, similarly, the P+ regions 54 and 56 do not extend along the entire length of the N-type region 45. They are utilized, rather, for the purpose of forming bipolar transistors in each of the respective regions 43 and 45, as will be described in more detail hereinbelow. This structure results in connecting portions 51 and 53 of the P-type region 43, and connecting portions 55 and 59 of the N-type region 45 for connecting the P+ contact region 52 and the N+ contact region 58 to respective ones of the channel regions extending between corresponding ones of the N-type regions 48 and 50, and the P-type regions 54 and 56. Preferably, the connecting portions 51 and 53 of P-type region 43 extend on opposite sides of the Source/Drain N+ regions 48 and 50, with the lengths of the N+ regions 48 and 50 extending therebetween to space apart portions 51 and 53. Likewise, the connecting the portions 55 and 59 of N-type region 45 preferably extend on opposite sides of the Source/Drain P+ regions 54 and 56, with the portions 55 and 59 also being spaced apart by the lengths of P+regions 54 and 56. Further, the gate electrodes 49 and 57 are dummy electrodes and do not need to extend up over the field isolation region 60.

Figure 4:
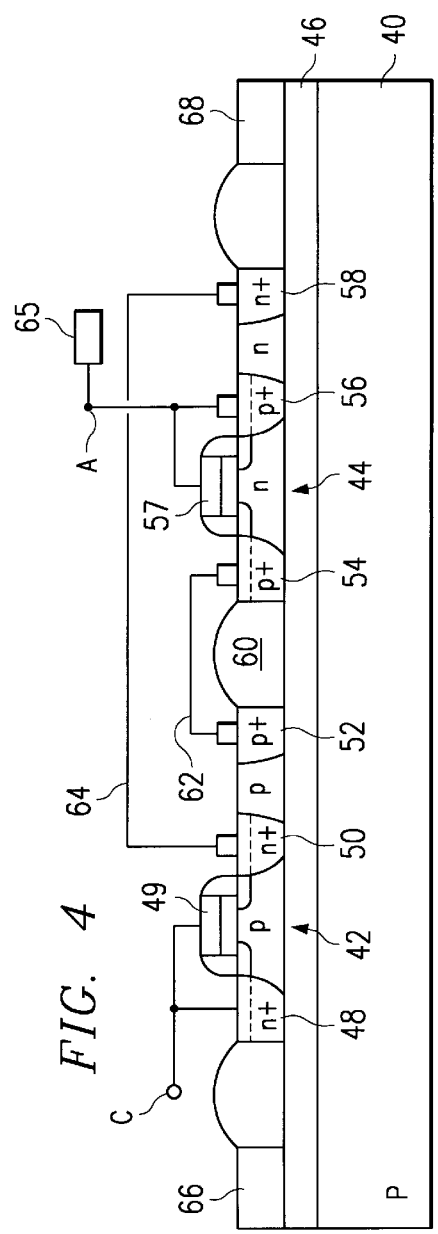
FIG. 4 illustrates a cross-sectional view of the bistable SCR-like switch of the integrated circuit of FIG. 3, taken along section line 4—4.

Referring now to FIG. 4, there is illustrated a more detailed cross-sectional view taken along section 4—4 of FIG. 3. It can be seen that the N+ regions 48 and 50 extend down to the oxide layer 46. Prior to processing, of course, the oxide layer 46 was formed by a conventional process such as a SIMOX process, which is operable to implant oxygen into the substrate which is then annealed such that the oxygen will oxidize a portion of the substrate 41 and form the layer 46. However, it is noted that the thickness of the upper substrate layer in which the transistors 42 and 44 are formed is relatively thin, on the order of 0.01–1.0 microns. As such, when the N+ regions 48 and 50 and the P+ regions 54 and 56 are formed, they typically will extend downward through the upper layer of the substrate 41 to contact the oxide layer 46. Therefore, if the N+ regions 48 and 50 and the P+ regions 54 and 56 extended the entire length of the respective regions 43 and 45, there would be no communication between the P type and the N type dummy channel regions underlying the channels extending between respective ones of the N+ regions 48 and 50 and the P+ regions 54 and 56, respectively, and the remainder of corresponding ones of the P region 43 and the N region 45. As such, it is important to note that for the purposes of forming the SCR-like bistable switch of the present invention, that the N+ regions 48 and 50 and the P+ regions 54 and 56 do not extend along the entire length of the associated regions 43 and 45. Additionally, it is noted that the P+ region 52 and the N+ region 58 extend downward to contact the oxide layer 46.

In subsequent processing steps, an upper level interconnect layer is formed. This layer can be formed in a conventional manner by first forming vias through a layer of inner level oxide and then depositing a metal layer thereon and patterning the metal layer. From an interconnection standpoint, a cathode "C" is formed which is interconnected to the N+ region 48 and the gate electrode 49. The N+ region 50 is connected to the N+ region 58, which is formed in the N-type region 45, by an interconnect 64. The P+ region 54 and the P+ region 52, which is formed in the P-type region 43, are connected together by an interconnect 62. The gate electrode 57 of transistor 44 is connected to the P+ region 56, this constituting the anode of the SCR-like bistable switch, this anode being connected to a pad 65.

Figure 5:
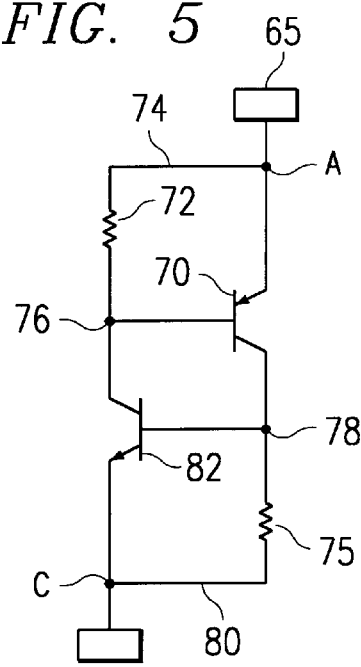
FIG. 5 illustrates a schematic diagram of the bistable SCR-like switch depicted in FIGS. 3 and 4.

Referring now to FIG. 5, there is illustrated a schematic diagram of the SCR-like bistable switch of the present invention. A PNP transistor 70 has the emitter thereof connected to the pad 65 on the anode, the anode represented by a node 74, the base thereof connected to a node 76 and the collector thereof connected to a node 78. A resistor 72 has one end connected the node 74 and the other end connected to the node 76. An NPN transistor 82 has the collector thereof connected to node 76, the base thereof connected to node 78 and the emitter thereof connected to the cathode, which is represented by a node 80, the cathode being connected to ground and the anode typically connected to input signal line, represented by pad 65. A resistor 75 has one end connected to the node 78 and the other end connected to the node 80.

The PNP transistor 70 is formed in the N-type region 45. The P+ region 56 comprises the emitter and the P+ region 54 comprises the collector, whereas the N-type material of the region 45 comprises the base, the base basically existing in the "dummy channel" region of the transistor 44. In a similar manner, the NPN transistor 82 is formed within the P-type region 43, wherein the emitter thereof is formed by the N+ region 48, the collector region formed by the N+ region 50 and the base region being formed within the P-type material of the region 43. The N+ regions 48 and 50 must be configured such that they do not confine the dummy channel region disposed therebetween from the remainder of the P-type region 43. This is such that the base thereof can be interfaced with the P+ region 52. Since the upper level portion of the substrate overlying the oxide layer 46 is relatively thin and the N+ regions 48 and 50 extend downward thereto, it is necessary that there be a conductive path around the regions 48 and 50.

Unlike the prior art, the resistor 72 and the resistor 75 are not formed in active regions of the transistors 42 and 44 of the preferred embodiment. The resistor 72 is not formed in the N-type region 45 between the N+ region 58 and the base of the PNP transistor 70 in the dummy channel region underlying the gate electrode 57. Similarly, the resistor 75 is not formed in the P-type region 43 between the P+ region 52 and the base of the NPN transistor 82 in the dummy channel region underlying the gate electrode 49. Rather, the resistors 72 and 75 are provided external to the transistors 42 and 44, such as by being formed in doped portions of active regions other than those active regions in which transistors 42 and 44 are formed. The resistors 72 and 75 can be formed in other active regions 66 and 68 as diffused resistors or in the poly layer as poly resistors, with the interconnect layer providing an interconnect thereto. It should be also be noted that the gate electrodes 49 and 57 are not required and, therefore, they could be removed from the substrate after formation thereof. However, in order to form the N+ regions 48 and 50 and the P+ regions 54 and 56, the gate electrodes 49 and 57 are required as a masking step, this being a conventional transistor formation process.

Referring now to FIG. 6, there is illustrated a cross-sectional diagram of a substrate for forming the bistable SCR-like transistor of the present invention. The substrate, described above, is a P-type substrate which is referred to by reference number 92. An oxide layer 94 is formed therein with an implantation method, such as the SIMOX method described above. This will result in an overlying layer of silicon above the oxide layer 94. Thereafter, as also described hereinabove, masking techniques are utilized in conjunction with implantation techniques to form P-well regions 102 and N-well regions 100. Trench isolation techniques or LOCOS field oxide techniques are utilized to isolate the regions 100 and 102 with an isolation oxide region 98, noting that this region 98 extends downward to the oxide layer 94 and becomes a part thereof. Thereafter, a layer of polycrystalline silicon is deposited on the substrate as a conformal layer and then patterned to form a gate electrode 108 within region 102 and a gate electrode 109 within region 100. Prior to forming the conformal layer of polysilicon, a layer of gate oxide 106 is deposited, such that the resulting gate electrodes 108 and 109 are separated from the substrate thereby.

After formation of the gate electrodes 108 and 109, the N-well region 100 is asked off and an LDD implant performed within the P-well region, with the gate electrode 108 providing a mask. The next step is to mask off the P-region 102 and perform an LDD implant into the N-region 100, as illustrated in FIG. 7. This results in the formation of LDD regions 112 in the transistor formed in region 102 and LDD regions 116 in the transistor formed in the region 100.

In the next step of the process, as illustrated in FIG. 8, sidewall oxide layers 118 are formed on the vertical walls of the gate electrodes 108 and 109 with a conventional process. The sidewall oxide layers 118 provide spacers which are utilized to space subsequent source/drain implants therefrom. Once the sidewall oxide spacers 118 are formed, the N-region 100 is masked off and an implant of N-type impurities performed into the substrate on either side of the gate electrode 108, forming N+ source/drain regions 122. Also, the N+ region 123 is formed in the N-type region 100 at the same time as the source/drain regions 122 are formed in the P-type region 102. Thereafter, as illustrated in FIG. 9, the region 102 is masked off and implants made into the region 100 to form P+ regions 126 on either side of the gate electrode 109. Also, a P+ region 128 is formed in the N-type region 102 at the same time the P+ source/drain regions 126 are formed in the region 100.

It should be noted that the masking steps described above with reference to FIGS. 6–9, are conventional along the portion of the width of a transistor being formed which extends between and includes the Source/Drain regions of the transistor. For example, the region 100 is exposed in the masking operation to allow forming of the N+ Source/Drain regions 118 in the P-type region 102, with the gate electrode 108 defining the channel region therebelow in a self-aligned technique. However, these masking steps are not conventional along the length of the transistor being formed, and the portion of the width of the transistor which extends on at least one side of the Source/Drain regions for providing connective portions of the regions of the substrate region in which the transistor is being formed. For example, with respect to differences in masking along the length of the transistor being formed, as depicted in FIG. 3, the connecting portions 51 and 53 of P-type region 43 are disposed on opposite sides of the length of the N+ regions 48 and 50 of the transistor 42, and are provided by masking off portions 51 and 53 prior to N+ regions 48 and 50 being implanted. With respect to the width of the transistor being formed, the masking steps illustrated in FIGS. 6–9 differ from conventional masking techniques in that the portion of the region 102 in which the P+ region 128 is formed is masked off as the N+ regions 122 are being implanted, as depicted in FIG. 8, and the portion of the region 100 in which the N+ region 123 is formed is masked off as the P+ regions 126 are being formed, as depicted in FIG. 9.

Additionally, a portion of the region 102 is also masked off to provide a P-type region for later formation of the separating portion of the P-type region 102 disposed between the P+ region 128 and the most adjacent source/drain region 122. Also, along the length thereof, the masking prevents the source/drain regions 122 and the LDD regions 112 from extending between the field oxide 98 boundaries along the length of the transistor. This provides for the above noted advantage of allowing the dummy channel regions to communicate with the remaining of the regions in which they are formed. Further, the advantage is that the NPN and PNP transistors are formed in the same process as conventional MOS type transistors. One difference between a conventional SCR and the SCR-like bistable switch of the present invention is that the NPN and PNP transistors must be formed in separate and isolated active regions and therefore require an interconnect layer to form the entire SCR-like device. For this reason, it is not a true SCR.

In summary, there is provided an SCR-like bistable switch which is formed utilizing SOI technology. In this technology, an NPN transistor and a PNP transistor are formed in separate active regions which are isolated from each other by field oxide regions and the underlying embedded oxide layer. This requires an upper interconnect layer for interconnecting the two NPN and PNP transistors with the required resistances, which may be formed in other active regions.

Although the preferred embodiment has been described in detail, it should be understood that various changes, substitutions and alterations can be made therein without departing from the spirit and scope of the invention as defined by the appended claims.

What is claimed is:

1. An ESD protection device for protecting an active circuit fabricated in an SOI integrated circuit, which active circuit is connected to an ESD susceptible terminal, comprising:

a first region of a first conductivity type;

a second region of a second conductivity type opposite to said first conductivity type;

an isolation structure for electrically isolating said first and second regions;

a first bipolar transistor formed in said first region with a base of said first conductivity type;

a second bipolar transistor formed in said second region with a base of said second conductivity type;

a first contact of the first conductivity type material formed in said first region to allow the base of said first bipolar transistor to be connected external to said first region;

a second contact region of the second conductivity type formed in said second region to allow the base of said second bipolar transistor to be connected external to said second region; and an interconnect structure external to said first and second regions for interconnecting said first and second bipolar transistors to external resistors in an SCR-like configuration.

2. The ESD protection device of claim 1, wherein:

said first bipolar transistor is formed by forming an MOS transistor in said first region with first source/drain regions formed of the second conductivity type material and the channel region thereof comprised of the first conductivity type material, which said first source/drain regions form the collector and the emitter of said first bipolar transistor with the channel region thereof forming the base thereof; and said second bipolar transistor is formed by forming an MOS transistor in said second region with second source/drain regions formed of the first conductivity type material and the channel region thereof comprised of the second conductivity type material, wherein said second source/drain regions comprise the collector and the emitter of said second bipolar transistor.

3. The ESD protection device according to claim 2, wherein said isolation structure completely isolates said first and second regions.

4. The ESD protection device according to claim 3, wherein said first and second source/drain regions extend vertically downward from the surface of the respective one of said first and second regions to said isolation structure.

5. The ESD protection device according to claim 4, wherein at least one of each of said first and second source/drain regions does not extend the entire length of the respective one of said first and second regions to allow conduction between the respective one of said first and second contacts and respective portions of said first and second regions defining said bases of respective ones of said first and second bipolar transistors which are disposed between respective ones of said first and second source/drain regions.

6. A bistable switch for ESD protection of an SOI integrated circuit having an insulator layer, comprising:

a first transistor having a first P-type region connected to an anode, a second P-type region, and an intermediate N-type region disposed between and adjoining said first and second P-type regions, a second transistor which is separately disposed from said first transistor with an electrical isolation region therebetween, and having a first N-type region connected to a cathode, a second N-type region, and an intermediate P-type region disposed between and adjoining said first and second N-type regions;

wherein said intermediate P-type region is separately disposed and electrically isolated from said first and second P-type regions by said isolation region and the insulator layer of the SOI integrated circuit, and said intermediate N-type region is separately disposed and electrically isolated from said first and second N-type regions by said isolation region and the insulator layer of the SOI integrated circuit;

a first interconnection electrically connecting said anode to a protected circuit of said SOI integrated circuit;

a second interconnection electrically connecting said intermediate N-type region to said second N-type region;

a third interconnection electrically connecting said intermediate P-type region to said second P-type region;

a fourth interconnection electrically connecting said cathode to a region of the SOI integrated circuit for shunting ESD current passing through the bistable switch; and an external interconnect structure for interconnecting said first and second transistors to external resistors in an SCR-like configuration.

7. The bistable switch according to claim 6, wherein said first transistor is disposed within a P-well which is disposed upon an insulator of the SOI integrated circuit and said second transistor is disposed within an N-well disposed upon the insulator of the SOI integrated circuit.

8. The bistable switch according to claim 6, wherein:

said first transistor is disposed within an N-well which is disposed upon the insulator layer of the SOI integrated circuit and said second transistor is disposed within a P-well disposed upon the insulator layer of the SOI integrated circuit; and said N-well forms said intermediate N-type region and said P-well forms said intermediate P-type region, with said N-well and said P-well completely isolated by said isolation region and said insulator layer.

9. An SOI circuit, comprising:

an insulator layer extending within the SOI circuit and having an insulator surface;

a P-well disposed upon said insulator surface;

a N-well disposed upon said insulator surface, spaced apart from said P-well;

an electrical isolation region extending between said P-well and said N-well, and downward to said insulator surface;

first and second N-type regions disposed within said P-well, with said first N-type region spaced apart from said second N-type region by an intermediate region of said P-well;

first and second P-type regions disposed within said N-well, with said first P-type region spaced apart from said second P-type region by an intermediate region of said P-well;

a first interconnection electrically connecting said first P-type region to a protected circuit of the SOI integrated circuit;

a second interconnection electrically connecting said second P-type region to said P-well;

a third interconnection electrically connecting said second N-type region to said N-well;

a fourth interconnection electrically connecting said first N-type region to a discharge region of the SOI integrated circuit for shunting current associated with an ESD event being applied to said protected circuit through said first and second P-type regions and said intermediate region of said N-well, and through said first and second N-type regions and said intermediate region of said P-well, to said discharge region of the SOI integrated circuit;

fifth and sixth interconnections for connecting said first P-type region to one side of a first external resistive device, and said N-well to the other side of the first external resistive device; and sixth and seventh interconnections for connecting said first N-type region to one side of a second external resistive device, and the other side of the second external resistive device to said P-well.

\* \* \* \* \*